United States Patent [19]

Toriumi et al.

[11] Patent Number: 4,643,579
[45] Date of Patent: Feb. 17, 1987

[54] ALIGNING METHOD

[75] Inventors: Yuki Toriumi, Tokyo; Kazunori Suzuki, Yokohama; Hiroo Katsuta, Kawasaki, all of Japan

[73] Assignee: Canon Kabushiki Kaisha, Tokyo, Japan

[21] Appl. No.: 672,784

[22] Filed: Nov. 19, 1984

[30] Foreign Application Priority Data

Nov. 21, 1983 [JP] Japan .................................. 58-217790
Oct. 22, 1984 [JP] Japan .................................. 59-222652

[51] Int. Cl.⁴ ............................................. G01B 11/26
[52] U.S. Cl. ...................................... 356/401; 358/101
[58] Field of Search ....................... 356/399, 400, 401; 250/548, 557, 561; 358/101

[56] References Cited

U.S. PATENT DOCUMENTS

| 3,712,740 | 1/1973 | Hennings | 250/548 |
| 3,843,916 | 10/1974 | Trotel et al. | 356/399 |
| 4,301,363 | 11/1981 | Suzuki et al. | 250/548 |
| 4,504,148 | 3/1985 | Kuroki et al. | 356/401 |
| 4,545,684 | 10/1985 | Kuroki et al. | 356/401 |

OTHER PUBLICATIONS

Russell et al., *Nat. Bur. Stand.* (U.S.) *Spec. Publ.* 400-451, Apr. 1979.
Wojcik, *Electron Technology*, V. 10, N. 3, pp. 79-96, 1977.
Harper et al., *IBM Technical Disclosure Bulletin*, V. 13, N. 4, p. 1028, Sep. 1970.
Khoury et al., *IBM Technical Disclosure Bulletin*, V. 13, N. 3, p. 768, Aug. 1970.

*Primary Examiner*—F. L. Evans
*Assistant Examiner*—Joel L. Harringa
*Attorney, Agent, or Firm*—Fitzpatrick, Cella, Harper & Scinto

[57] ABSTRACT

A method of aligning a first object and a second object comprises the steps of detecting, in at least two directions of detection in each examination region of which is included the superposed portion of a first area type mark formed on the first object and a second area type mark formed on the second object when the two marks are seen from a predetermined direction, the lengths of the superposed portion and the non-superposed portion of the marks in the first and second objects or the images thereof, and comparing the detected lengths and operating a positional deviation.

18 Claims, 11 Drawing Figures

ALIGNING METHOD

BACKGROUND OF THE INVENTION

1. Field of the Invention

This invention relates to a method of aligning two objects, for example, two glass plates for liquid crystal.

2. Description of the Prior Art

Generally, transparent electrodes are used in various display plates such as liquid crystal display plates, and the usage of these display plates ranges over a wide field such as the dials of optical instruments, electronic instruments, timepieces, etc., large displays for liquid crystal televisions and thermometers. Two substrates for enclosing a material such as liquid crystal are used in such a display plate and each of these substrates is formed with a transparent electrode, and whether the patterns of these transparent electrodes are accurately in accord with each other is important in respect of the performance of the product.

Heretofore, such kind of alignment has been accomplished by printing an alignment mark M1 on one substrate and printing a similar mark M2 on the other substrate as shown in FIG. 1 of the accompanying drawings, and judging that alignment of the two substrates has been completed if the mark M2 enters into the mark M1 as shown in FIG. 1, but this judgment has been done by visual observation and accordingly, the work efficiency has been low and there has been a hindrance to the accuracy of alignment.

On the other hand, in a semiconductor printing apparatus, as a step before printing the semiconductor integrated circuit pattern of a mask on a wafer, there is the step of accurately aligning the mask and the wafer.

In the conventional alignment step, linear alignment marks are formed on the mask and the wafer in advance, and these marks are scanned by a laser beam and the scattered light from the marks is detected to thereby measure the relative positional deviation of the wafer and the mask. The wafer is then moved by the amount of this measured positional deviation, whereby accurate alignment of the mask and the wafer is effected. However, linear marks are generally hard to roughly adjust as compared with area type marks, and their detection output is usually weak and therefore, linear marks are liable to be affected by noise such as dust which may cause a reduction in output.

SUMMARY OF THE INVENTION

It is an object of the present invention to provide an aligning method which uses area type marks to facilitate rough adjustment and moreover can accurately accomplish the final alignment.

It is another object of the present invention to provide an aligning method in which first and second objects on which area type marks are formed are imaged on a television monitor and two video scanning lines are utilized to scan the superposed portion of the two marks so as to include at least such portion in a scanning region and the obtained scanning signals are operation-processed to thereby automatically accomplish alignment.

It is still another object of the present invention to provide an aligning method in which a first object is carried in earlier than a second object and a scanning signal obtained by scanning the first object or the image thereof in advance is stored and compared with a scanning signal obtained by the scanning when the second object has been carried in, to thereby accomplish alignment.

DETAILED DESCRIPTION OF THE PREFERRED EMBODIMENTS

Figure 1:
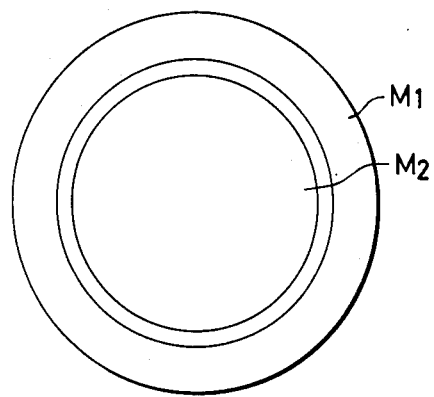
FIG. 1 is a plan view of marks for effecting the conventional alignment.
Figure 2:
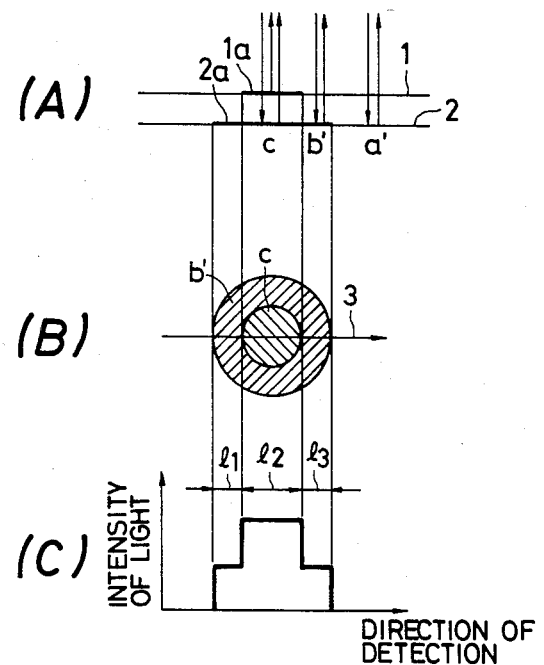
FIGS. 2(A), (B) and (C) illustrate the principle of the present invention.
Figure 3:
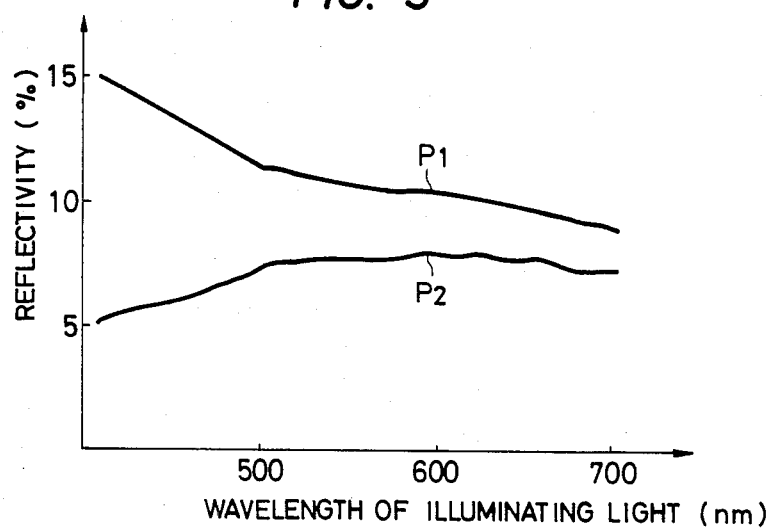
FIG. 3 is a graph showing the reflectivities of an alignment mark and a substrate used in an embodiment of the present invention.
Figure 4:
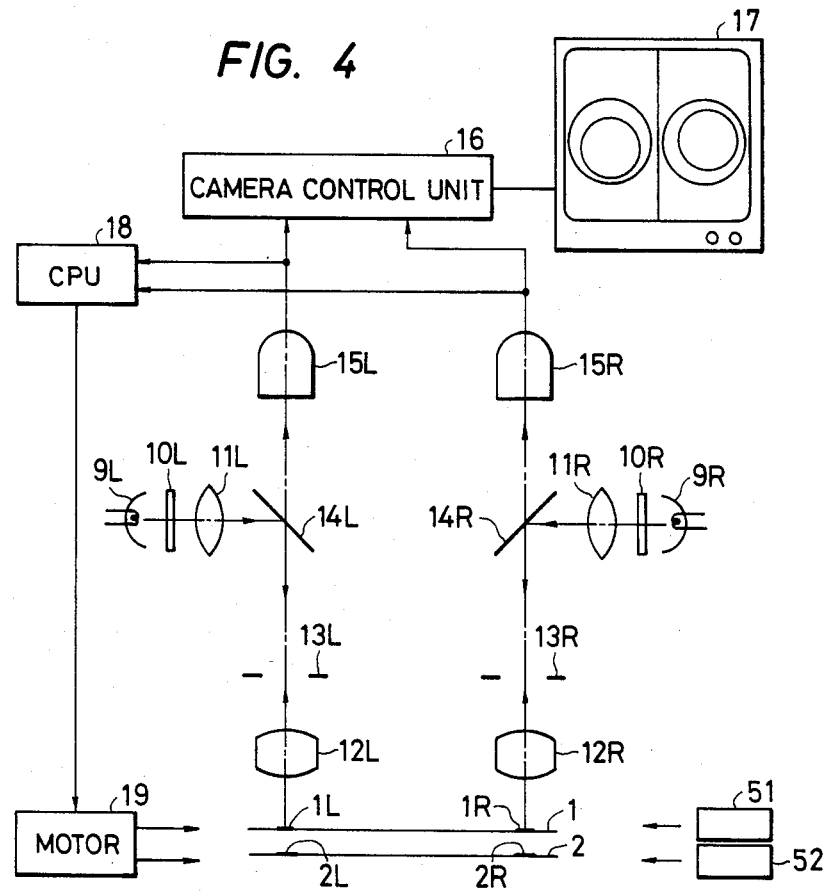
FIG. 4 schematically shows the construction of an aligning apparatus according to an embodiment of the present invention.

FIG. 2 illustrates the principle of the alignment used in an embodiment of the present invention, and in FIG. 2(A), there are partly shown the cross-sections of glass substrates 1 and 2 formed with circular alignment marks 1a and 2a formed of the material of transparent electrode and different in size. As shown in FIG. 3, as the wavelength of illuminating light becomes longer, the reflectivity (curve P1) of the marks 1a and 2a gradually decreases, while the reflectivity (curve P2) of the glass substrates 1 and 2 gradually increases. In the present embodiment, the glass substrates 1 and 2 are lower in reflectivity than the marks 1a and 2a. At least the mark 1a is of a light-transmitting property and when it is illuminated from above as viewed in FIG. 2, the reflected light thereof exhibits the highest intensity of light in a portion C wherein the marks 1a and 2a of the two substrates 1 and 2 overlap each other as shown in FIG. 2(B), because in this portion C, the reflection from the mark 1a of the upper substrate 1 and the reflection from the mark 2a of the lower substrate 2 are added together. The intensity of the reflected light becomes stepwisely weaker from the portion b' in which the mark is formed only on one of the two substrates to the portion a' of only the substrate 2 [see FIG. 2(C)]. That is, the portion C in which the marks 1a and 2a of the two substrates overlap each other, the portion b' in which the mark 2a is provided on one of the substrates and the portion a' of only the substrate 2 can be clearly distinguished from one another, and the sizes, shapes and relative position of the two marks 1a and 2a can be confirmed. Accordingly, by scanning the observed reflected lights in the direction of arrow 3 in FIG. 2(B) through a video signal or the like and detecting the difference in intensity of light therebetween, alignment of the substrates 1 and 2 becomes possible. Description will hereinafter be made on the assumption that accurate alignment of the two substrates is accomplished when the centers of the aforementioned two marks become coincident with each other. FIG. 4 schematically shows the construction of an apparatus according to an embodiment of the present invention for effecting the alignment of the glass substrates 1 and 2 shown at the bottom of FIG. 4. The glass substrates 1 and 2 are maintained parallel to each other and with a clearance of several microns therebetween by stage mechanisms, not shown. The glass substrates 1 and 2 are respectively formed with circular alignment marks 1R, 1L and 2R, 2L formed of the material of transparent electrode, the marks 1R and 1L corresponding to the marks 2R and 2L, respectively.

The construction of the apparatus of FIG. 4 will now be described. Filters 10R, 10L for intercepting infrared light, condenser lenses 11R, 11L and half-mirrors 14R, 14L are disposed along the optical paths of light sources 9R, 9L. Stops 13R, 13L and imaging lenses 12R, 12L are disposed along the optical paths reflected by the half-mirrors 14R, 14L, and light beams transmitted through the imaging lenses 12R and 12L are imaged on the glass substrates 1 and 2, respectively. The glass substrates and marks used in the present embodiment exhibit a high light intensity difference of reflected light for an illuminating light of a short wavelength, as shown in FIG. 3, and therefore use is made of the filters 10R and 10L for intercepting infrared light. Also, this illuminating system adopts the light field illumination method. The light field illumination is an illumination method whereby the stops 13R and 13L are disposed at the rearward focus positions of the imaging lenses 12R and 12L to form a telecentric optical system for illuminating light and an object is observed by the use of the regular reflection of the illuminating light.

Half-mirrors 14R, 14L and pickup tubes 15R, 15L are disposed along the optical paths reflected by the substrates 1 and 2, and as regards images photographed by the pickup tubes 15R and 15L, a picture plane is divided into two by a camera control unit 16 and displayed on a monitor television 17.

The video signals of the pickup tubes 15R and 15L, as will later be described, are input to a central processing unit (CPU) 18 for effecting the detection of the relative position of the substrates 1 and 2, and a motor 19 is driven in accordance with the result of the operation of the central processing unit 18 to operate the stage mechanisms, not shown, for holding the substrates 1 and 2, respectively, thereby effecting the alignment of the substrates 1 and 2.

Figure 5:
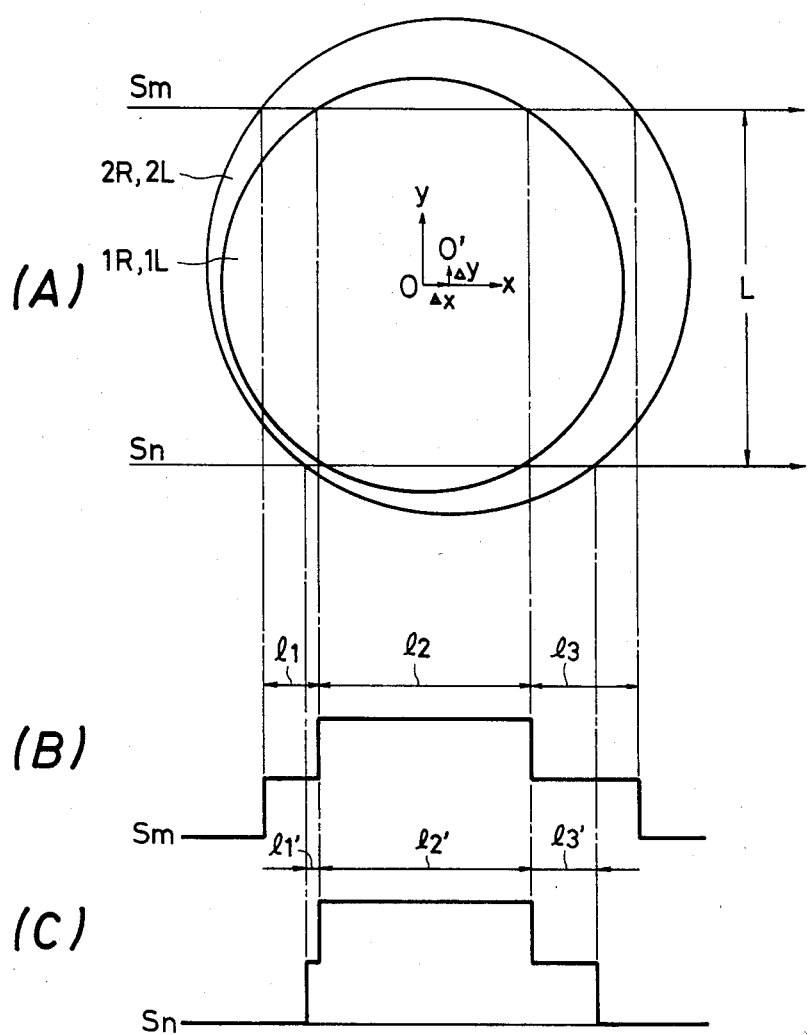
FIGS. 5(A), (B) and (C) are illustrations regarding alignment marks used in the apparatus of FIG. 4.

The operation of the above-described construction will now be described. The substrates 1 and 2 are roughly aligned in advance and the marks 1R, 2R and 1L, 2L are disposed in the projection fields of the imaging lenses 12R and 12L, respectively, and if there occurs a positional error, there occurs a deviation between the marks 1R, 1L of the substrate 1 and the marks 2R, 2L of the substrate 2 as shown in FIG. 5(A) and this deviation is displayed on the monitor television 17. For simplicity of the description, the relation between the marks 1R and 2R will hereinafter be described.

When the two scanning lines Sm and Sn of the video signals of the aforementioned images are detected by the central processing unit 18, signals of high voltage are obtained for a predetermined time in accordance with the difference in intensity between the reflected lights from the marks 1R and 2R, as shown in FIGS. 5(B) and (C). If in the scanning line Sm, the distance $l_1$ of the portion first reflected from only the mark 2R, the distance $l_2$ of the portion in which the marks 1R and 2R overlap each other and the distance $l_3$ of the portion finally reflected from only the mark 2R are detected and also in the scanning line Sn, the distances $l_1'$, $l_2'$ and $l_3'$ are likewise detected, the positional error $\Delta Xr$ of the marks 1R and 2R in X direction and the positional error $\Delta Yr$ of these marks in Y direction can be found by:

$$\Delta Xr = \frac{l_3 - l_1}{2} = \frac{l_3' - l_1'}{2}$$

$$\Delta Yr = \frac{(M^2 - M'^2) - (l_2^2 - l_2'^2)}{8L}$$

In the above equations, $M = l_1 + l_2 + l_3$, $M' = l_1' + l_2' + l_3'$ and L is the distance between the scanning lines Sm and Sn. Likewise, with regard also to the left marks 1L and 2L of the substrates 1 and 2, the positional error $\Delta Xl$ in X direction and the positional error $\Delta Yl$ in Y direction can be detected.

Then, if the distance between the marks 1R, 2R and 1L, 2L is R, the relative positional error of the substrates 1 and 2 can be detected by the use of:

$$\Delta X = \frac{\Delta Xr + \Delta Xl}{2}$$

$$\Delta Y = \frac{\Delta Yr + \Delta Yl}{2}$$

$$\Delta \theta = -\tan^{-1} \frac{(\Delta Yl - \Delta Yr)}{R}$$

When the central processing unit 18 effects the foregoing operation and detects $\Delta X$, $\Delta Y$ and $\Delta \theta$, the motor 19 drives the stage mechanisms for holding the substrates 1 and 2 in accordance with the result of this operation, and effects accurate alignment of the substrates 1 and 2.

If the two marks are parallel to X direction, alignment will be completed by one alignment operation, but if the two marks have a certain angle with respect to X direction, a difference will occur between the actual amount of drive and the calculated value and therefore, alignment will not be completed by one operation. However, if a similar operation is repeated several times, alignment will be completed.

In FIG. 4, reference numerals 51 and 52 designate means for carrying in the glass substrates 1 and 2.

Figure 6:
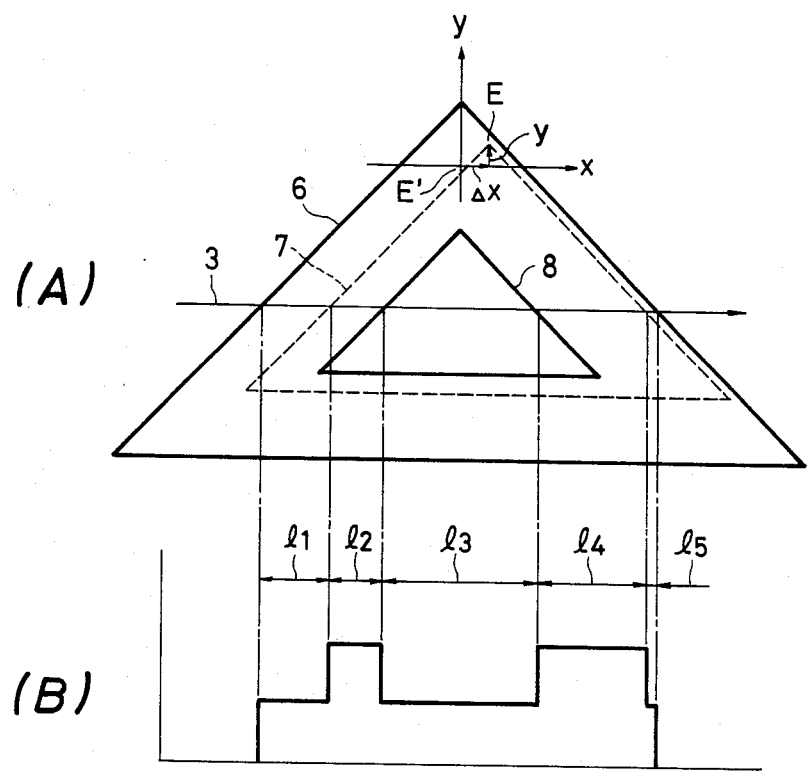
FIG. 6 illustrates alignment marks in another embodiment of the present invention.

In the above-described embodiment, two circular marks different in size have been described, whereas marks of the same size would result in a similar effect and further, alignment would also be possible with respect to marks of other shape. FIG. 6(A) shows isosceles triangular marks 6 and 7, of which the larger mark 6 is formed with an isosceles triangular hole 8 having edges parallel to the outer side edges of the mark 6. In FIG. 6(B), the positional errors of the marks 6 and 7 are:

$$\Delta X = \frac{(l_1 - l_2) + (l_4 - l_5)}{4}$$

$$\Delta Y = \frac{-(l_1 - l_2) + (l_4 - l_5)}{4}$$

In this case, only one direction of detection is required due to the presence of the hole.

Figure 7:
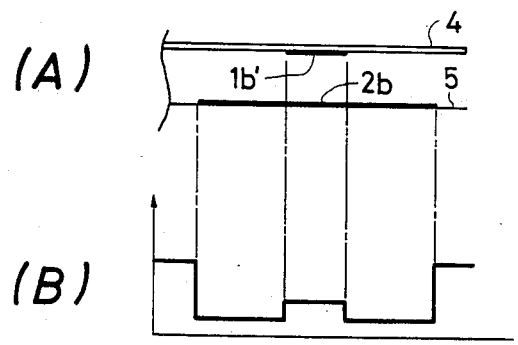
FIG. 7 illustrates an embodiment applied to a semiconductor printing apparatus.

The present invention is further usable for the alignment of a mask and a wafer in a semiconductor printing apparatus, and in such case, the wafer is a substantially specular surface and therefore, as shown in FIG. 7(A), a portion 2b of low reflectivity can be formed on the wafer 5 to thereby form a distribution of reflected light as shown in FIG. 7(B). In FIG. 7, reference numeral 4 designates the mask, and reference character 1b' denotes a mark formed of the material of transparent electrode.

Figure 8:
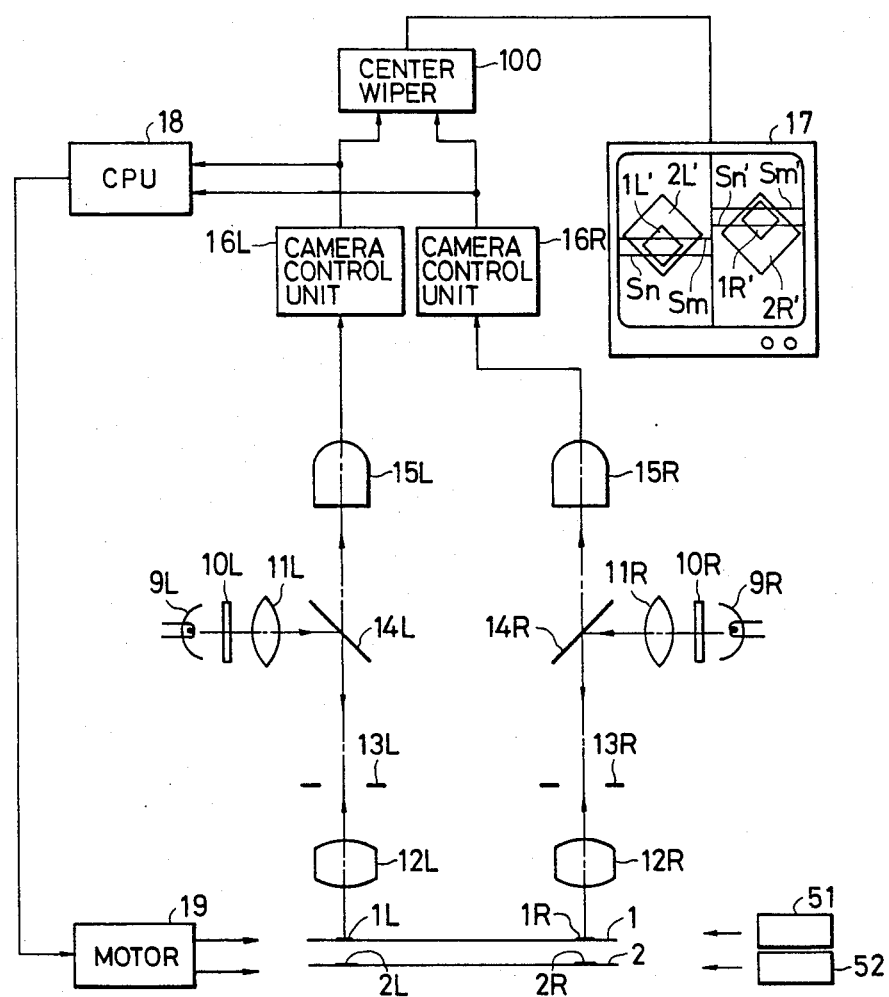
FIG. 8 shows another embodiment of the present invention.

Another embodiment of the present invention will now be described by reference to FIG. 8 and so forth. In this embodiment, reference numerals similar to those in the embodiment of FIG. 4 designate similar members.

Half-mirrors 14R, 14L and pickup tubes 15R, 15L are disposed along the optical paths reflected by substrates 1 and 2, and images photographed by the pickup tubes 15R and 15L are displayed on a monitor television 17 through camera control units 16R and 16L.

The images of the marks discretely photographed by the pickup tubes 15R and 15L are combined together by a center wiper 100.

The positions of two scanning lines relative to the images of the respective marks can be discretely adjusted vertically of the monitor by an electrical processing unit which will later be described.

The substrates 1 and 2 are roughly aligned in advance and square marks 1R, 2R and 1L, 2L similar to each other are disposed in the projection fields of the imaging lenses 12R and 12L, respectively, so that they are superposed one upon the other. If a positional error occurs, there occur deviations between the images 1R', 1L' of the marks of the substrate 1 and the images 2R', 2L' of the marks of the substrate 2 as shown in the upper portion of FIG. 8 and these deviations are displayed on the monitor television 17. For simplicity of the description, the relation between the mark images 1R' and 2R' will hereinafter be described.

Figure 9:
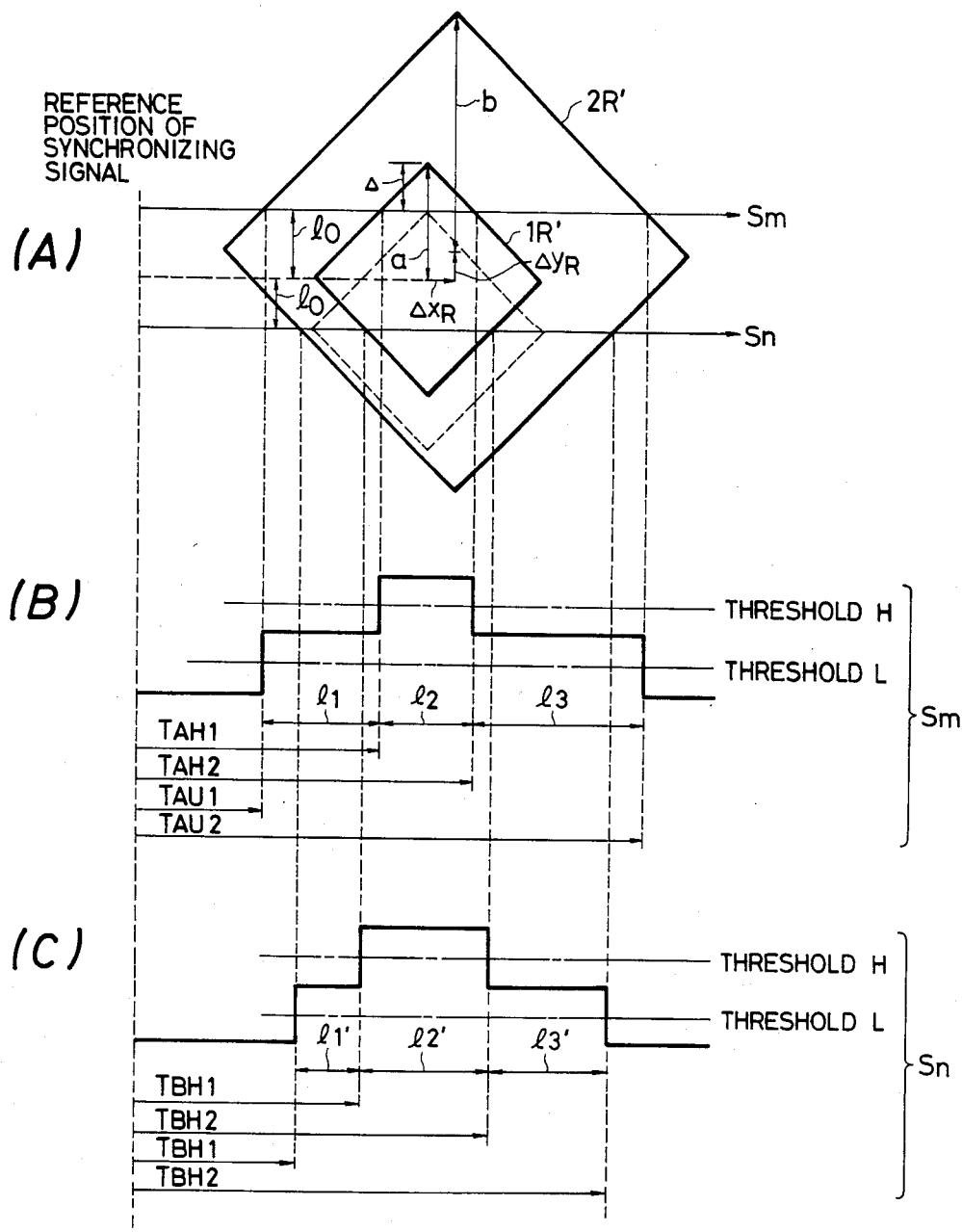
FIGS. 9(A), (B) and (C) illustrate the alignment effected by the use of two scanning lines.

When the two scanning lines Sm and Sn of the video signals of the images are detected by the central processing unit 18 as shown in FIG. 9(A), signals of high voltage are obtained for a predetermined time in accordance with the difference in intensity between the reflected lights from the mark images 1R' and 2R' on the respective scanning lines. That is, at least the mark 1R is semitransparent, while at least the mark 1L is reflective, and when these marks are illuminated from above them, the reflected lights thereof exhibit the highest intensity of light in the portion wherein the marks 1R and 2R of the two substrates 1 and 2 overlap each other because, in this portion, the reflection from the mark 1R of the upper substrate 1 and the reflection from the mark 2R of the lower substrate 2 are added together. The intensity of the reflected light becomes weaker in the portion wherein a mark is formed on only one of the two substrates [see FIGS. 9(B) and (C)]. That is, the portion in which the marks 1R and 2R of the two substrates overlap each other, the portion in which the mark 2R is provided on one of the substrates and the portions of only the substrates can be clearly distinguished from one another and the relative position of the two marks 1R and 2R can be confirmed. The marks 1R and 2R are of a square shape as shown in FIG. 9(A) so that the scanning lines Sm and Sn of the video signals which are parallel to each other intersect the respective side edges of the square at 45°. If the angle of intersection is 0° (or 90°), the positional deviation in Y direction cannot be detected, and the angle of intersection may be any other angle, but if it is 45°, the detection accuracy in X direction can be made equal to the detection accuracy in Y direction.

The sizes of the squares are determined as follows by taking into account the limit amount of displacement $\Delta$ at which the smaller square (which is superposed on the larger square) with the diagonal lengths as $2a$ and $2b$ does not intersect the scanning lines Sm and Sn and the spacing $2l_o$ between the scanning lines Sm and Sn. That is, as the condition under which the left upper side edge of the mark image 1R' intersects the scanning line Sm, $$\Delta = a - l_o \quad (1),$$

and as the condition under which the left lower side edge of the mark image 1R' intersects the scanning line Sn, $$\Delta = l_o \quad (2)$$

and as the condition under which the mark image 1R' does not protrude from the mark image 1L' even if it is displaced by $2\Delta$ in each of the horizontal and vertical directions, $$2\sqrt{2\Delta} = \frac{b}{\sqrt{2}} - \frac{a}{\sqrt{2}}. \quad (3)$$

From equations (1), (2) and (3), $a = 2\Delta$ and $b = 6\Delta$ are set.

Now, alignment errors $\Delta X$, $\Delta Y$ and $\Delta \theta$ can be found as follows from the distances $l_1$, $l_2$, $l_3$, $l_1'$, $l_2'$ and $l_3'$ detected by the two scanning lines Sm and Sn as shown in FIGS. 9(B) and (C).

That is, when the errors in X direction and Y direction with respect to the mark images 1R' and 2R' are $\Delta XR$ and $\Delta YR$, respectively, $$\Delta XR = \frac{(l_3 - l_1) + (l_3' - l_1')}{4} \quad (4)$$

$$\Delta YR = \frac{(l_1 + l_3) - (l_1' + l_3')}{4}. \quad (5)$$

Likewise, the errors $\Delta XL$ and $\Delta YL$ in X direction and Y direction with respect to the mark images 1L' and 2L' can be found and, if the distance when the marks 1R, 2R and 1L, 2L are projected onto the image pickup surface is R, $\Delta X$, $\Delta Y$ and $\Delta \theta$ can be found as follows:

$$\Delta X = \frac{\Delta XR + \Delta XL}{2} \quad (6)$$

$$\Delta Y = \frac{\Delta YR + \Delta YL}{2} \quad (7)$$

$$\Delta \theta = -\tan^{-1} \frac{(\Delta YL - \Delta YR)}{R} \quad (8)$$

Figure 10:
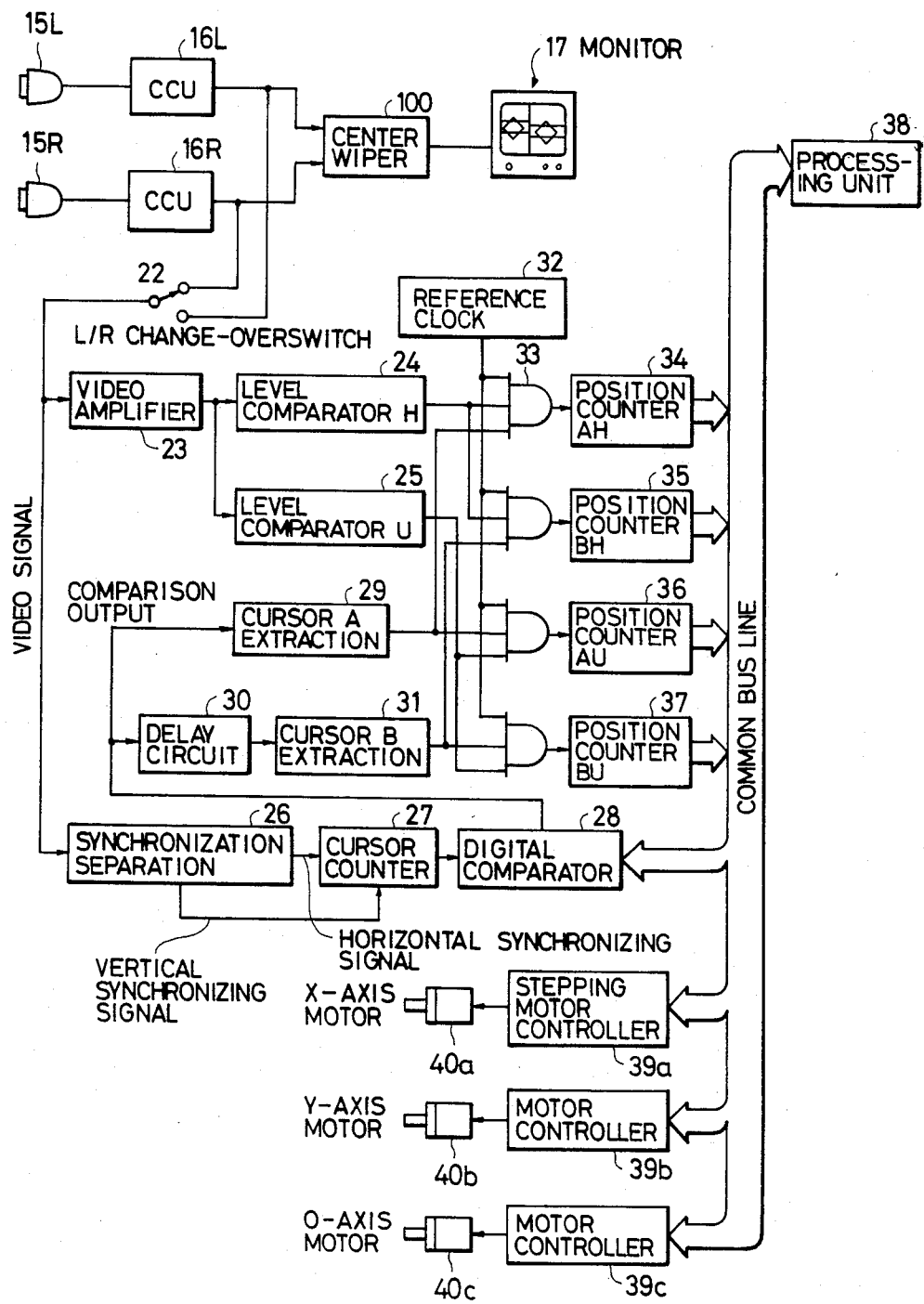
FIG. 10 shows an embodiment of the image signal processing.

An embodiment of the image signal processing is shown in FIG. 10. Reference numeral 22 designates a left-right change-over switch used to effect the detection of the positions of the left and right marks by a single detecting system. Reference numeral 23 denotes a video amplifier, and reference numerals 24 and 25 designate level comparators for transforming the amplified video signal into a binary form as shown in FIGS. 9(B) and (C). Reference numeral 26 denotes a synchronization separation circuit, reference numeral 27 designates a cursor counter, reference numeral 28 denotes a digital comparator, and reference numerals 29 and 31 designate cursor extraction circuits for displaying the two scanning lines Sm and Sn on the monitor 17. That is, the image signal input to the synchronization separation circuit 26 is taken out as a horizontal synchronizing signal and a vertical synchronizing signal and input to the cursor counter 27, whereby the pulse number of the horizontal synchronizing signal is counted. The counted data is input to the digital comparator 28 and a coincidence pulse is put out from the digital comparator 28 at a point of time whereat the counted data is coincident with the position data of the scanning line Sm designated in advance by an operation processing unit 38. The cursor A extraction circuit 29 puts out one horizontal scanning line immediately after the generation of this coincidence pulse as a cursor A scanning period signal. A delay circuit 30 and cursor extraction circuit 31 put out a scanning time signal for displaying the scanning line Sn at a point of time delayed by a predetermined time with respect to the cursor A.

A reference clock 32 has its frequency set so that the pulse number thereof represents the actual mark position information. For example, if the distance resolving power is 10 μm and a ⅔ inch tube is used as the pickup tube of a television camera, the clock frequency f will be $$f = \frac{8.8}{\beta} \times \frac{1}{T_o} \times \frac{1}{10^{-2}},$$

where To is the effective horizontal scanning time which is $53 \times 10^{-6}$ sec., and $\beta$ is the magnification of the projection optical system and if $\beta = 2.5$, $f \approx 6.6$ MHz.

The outputs of the level comparators 24, 25, the outputs of the cursor extraction circuits 29, 31 and the clock pulse are input to respective position counters 34-37 through an AND gate circuit 33. The position data TAH1 and TAH2 from the horizontal synchronizing pulse of a portion in which the mark images 1R' and 2R' in the cursor A overlap each other are obtained in the position counter 34, the position data TAV1 and TAV2 from the horizontal synchronizing pulse of the portion of only the mark image 2R' are obtained in the position counter 35, and likewise, data TBH1 and TBH2 are obtained from the position counter 36 and data TBV1 and TBV2 are obtained from the position counter 37. These data are input to the operation processing unit 38 through a common bus line. Thus, the relative position errors ΔX, ΔY and Δθ as previously described can be found. In FIG. 10, reference numeral 100 designates a center wiper for electrically shifting the image on the monitor, reference characters 39a-39c denote X-, Y- and θ-axis stepping motor controllers, and reference characters 40a-40c designate X-, Y- and θ-axis driving motors.

In the above-described embodiment, it has been shown that when position detection is to be effected by the scanning lines Sm and Sn, both of the substrates 1 and 2 are present and are scanned at a time, but it is also possible that as will be described below, the substrate 1 is first carried in and scanned and the obtained scanning signal is stored, whereafter the substrate 2 is carried in and scanned and the obtained scanning signal is compared with the first-mentioned scanning signal. That is, the upper substrate 1 is first carried into the alignment stage by the stage mechanism and is set in the depths of the imaging lenses 12R and 12L, and the marks 1R and 1L enter the view field of the monitor television, and then the lower substrate is carried onto the stage and is set in the depths of the imaging lenses 12R and 12L by the pushing-up mechanism of the stage, and the marks 2R and 2L enter the view field of the monitor television.

The position information of the marks 1R and 1L is stored during the time from after the marks 1R and 1L have entered the depths of the imaging lenses until the marks 2R and 2L of the substrate 2 enter the view field. At this time, binarization of the scanning signals can be effected not at the threshold level H but at the threshold level L shown in FIGS. 9(B) and (C).

The binarization of the scanning signal obtained from the substrate 2 carried in the field of view of the television is executed with respect to the threshold level L as shown in FIGS. 9(B) and 9(C). When the scans are separately conducted at a time interval, the level comparator H24 may be omitted from the circuit because the binary level is only one, that is, L level. Thus, the processing circuit may be simplified. The information from the substrate 1 may be advantageously stored separately from the information from the substrate 2.

For example, even when alignment cannot be accomplished by one processing, if the substrate 1 is fixed and the stage for the substrate 2 is driven to effect alignment, the second alignment can be accomplished by only knowing the information of the substrate 2 from the marks 2R and 2L.

Figure 11:
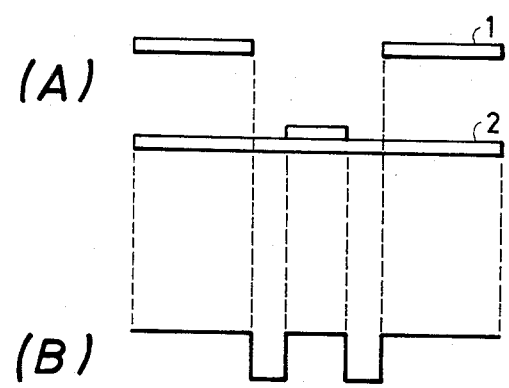
FIGS. 11(A) and (B) are illustrations regarding different alignment marks.

Now, in the above-described embodiments, in addition to detecting the reflected lights from the first and second objects, transmitted light may be detected and further, one object may be detected by the reflected light and the other object may be detected by the transmitted light. The reflected light is not limited to regular reflection, but may also be scattered light. The area type marks are not limited to square marks but may also be other polygonal marks, and the area type marks are not limited to the marks attached to the first and second objects, but may also be marks of opening portions provided in the first and second objects as shown in FIG. 11(A), or marks equivalent thereto but transmitting light by the mark portion and reflecting or absorbing light by the non-mark portion. That is, the area type marks may also be ones which are in the negative-positive (inverted white and black) relation with the above-described embodiments. An example of the output of the scanning signal in this case is shown in FIG. 11(B). The scanning is not limited to television scanning, but the objects may also be scanned by a laser or the like.

The sizes of the first and second marks are not limited to such a relation that one of them is larger and the other is smaller, but the two marks may also be of the same size. Further, the scanning lines are not limited to two, but may also be three or more.

While the present invention has been described with respect to the embodiments using a scanning system, use need always be made of the scanning system but design may also be made such that, for example, measurement of the lengths of a superposed portion and a non-superposed portion is effected.

According to the present invention, as described above, the lengths of the superposed portion and the non-superposed portion of the area type marks in the first and second objects or the images thereof can be detected to thereby accomplish accurate alignment, of course, and the use of the area type marks readily appeals to sense and easily enables rough adjustment. If the output in the superposed portion of the marks is high, position detection can be accomplished stably even if noise such as dust comes into the superposed portion to cause some reduction in the output thereof.

What is claimed is:

1. A method for positioning a first object and a second object with respect to each other, comprising:
    illuminating said first and second objects having a first area type mark and a second area type mark, respectively;
    detecting the intensity of the light from said objects along at least two detection paths that include said marks, wherein each path crosses the marks in a first region where the marks are superposed and in a second region where the marks are not superposed, and wherein each path further crosses a third region of the objects that does not include the area marks; and
    comparing the lengths of said superposed and non-superposed regions, which lengths are obtained from differences in the intensity of the light from said three regions, so as to calculate the deviation of the relative location of said objects.

2. A method according to claim 1, wherein the detection of the lengths of the superposed region and the non-superposed region is affected with respect to the images of said first and second marks imaged on a television monitor.

3. A method according to claim 1, wherein said first and second marks are circular.

4. A method for positioning a first object and a second object with respect to each other, comprising:
    illuminating said first and second objects having a first area type mark and a second area type mark, respectively;
    detecting the intensity of the light from said objects along a single detection path that includes said marks, wherein the path crosses the marks in a first region where the marks are superposed and in a second region where the marks are not superposed, and wherein the path further crosses a third region of the objects that does not include the area marks; and
    comparing the lengths of said superposed and non-superposed regions, which lengths are obtained from differences in the intensity between the light from said three regions, so as to calculate the deviation of the relative location of said objects.

5. A method according to claim 4, wherein the detection of the lengths of the superposed region and the non-superposed region is effected with respect to the images of said first and second marks imaged on a television monitor.

6. A method according to claim 4, wherein said first and second marks are triangular, one of said marks having a triangular opening therein.

7. A method for positioning a first object and a second object with respect to each other, comprising:
    illuminating the first and second objects having a first area type mark and a second area type mark, respectively;
    scanning the light from said objects including said marks along at least two detection paths that include said marks, wherein each path crosses the marks in a first region where the marks are superposed and in a second region where the marks are not superposed, and wherein each path further crosses a third region of the objects that does not include the area marks;
    obtaining the differences in intensity between the light from said three regions, from scanning signals of the light from the first object and the second object, so as to calculate the deviation of the relative location of said objects.

8. A method according to claim 7, wherein said first and second marks are polygonal.

9. A method according to claim 8, wherein said first and second marks are square marks each inclined at 45° with respect to the detection paths.

10. A method according to claim 7, wherein the light from said first and second objects are simultaneously scanned.

11. A method according to claim 7, wherein the light from said first and second objects is scanned at a predetermined time interval.

12. A method according to claim 11, wherein said first object and said second object are scanned respectively at first and second scanning positions, and said first object is placed in the first scanning position before said second object is placed in the second scanning position, and the scanning signals obtained by scanning the light from said first object are stored and compared with the scanning signals obtained by the scanning after said second object has been placed in the second scanning position.

13. A method according to claim 12, wherein a binarization level of the scanning signals employed when scanning the light from the first object is identical to the binarization level of the scanning signals employed when scanning after the second object has been placed in the second scanning position.

14. A method according to claim 7, wherein said scanning along said detection paths is effected by scanning lines of a television by which said first and second objects are imaged.

15. A method according to claim 7, wherein at least one of said first and second marks is a mark attached to the object.

16. A method according to claim 7, wherein at least one of said first and second marks is an opening in the object.

17. A method according to claim 7, wherein said first mark is semitransparent and said second mark is reflective.

18. An apparatus for positioning a first object and a second object with respect to each other, comprising:
    means for carrying onto an alignment stage said first object on which a first area type mark is formed;
    means for carrying onto the alignment stage said second object on which a second area type mark is formed;
    means for imaging said first and second objects on a television monitor so as to include at least said first and second marks;
    means for electrically scanning the images of said first and second objects along at least two scanning lines, each line including a superposed portion of said first and second marks;
    means for detecting a region in which scanning signals of the images of said first and second objects become greater than a predetermined intensity so as to calculate the deviation of the relative location of said objects; and
    means for displacing said first and second objects relative to each other so as to correct the positional deviation.

* * * * *